(12) United States Patent
Chang et al.

(10) Patent No.: US 8,513,127 B2
(45) Date of Patent: Aug. 20, 2013

(54) CHEMICAL MECHANICAL PLANARIZATION PROCESSES FOR FABRICATION OF FINFET DEVICES

(75) Inventors: Josephine B. Chang, Bedford Hills, NY (US); Leslie Charns, San Jose, CA (US); Jason E. Cummings, Smithfield, NC (US); Michael A. Guillorn, Yorktown Heights, NY (US); Lukasz J. Hupka, Croton-on-Hudson, NY (US); Dinesh R. Koli, Tarrytown, NY (US); Tomohisa Konno, Mie (JP); Mahadevaiyer Krishnan, Hopewell Junction, NY (US); Michael F. Lofaro, Danbury, CT (US); Jakub W. Nalaskowski, Yorktown Heights, NY (US); Masahiro Noda, Mie (JP); Dinesh K. Penigalapati, Tarrytown, NY (US); Tatsuya Yamanaka, Mie (JP)

(73) Assignees: International Business Machines Corporation, Armonk, NY (US); JSR Corporation, Tokyo (JP)

( * ) Notice: Subject to any disclaimer, the term of this patent is extended or adjusted under 35 U.S.C. 154(b) by 278 days.

(21) Appl. No.: 13/012,836

(22) Filed: Jan. 25, 2011

(65) Prior Publication Data
US 2012/0083123 A1 Apr. 5, 2012

Related U.S. Application Data

(60) Provisional application No. 61/389,546, filed on Oct. 4, 2010.

(51) Int. Cl.
*H01L 21/302* (2006.01)

(52) U.S. Cl.
USPC ........... 438/693; 438/689; 438/690; 438/691; 438/692; 216/37; 216/67

(58) Field of Classification Search
USPC .............................. 438/689–693; 216/37, 67
See application file for complete search history.

(56) References Cited

U.S. PATENT DOCUMENTS

| 4,954,459 A | 9/1990 | Avanzino et al. |
| 4,962,064 A | 10/1990 | Haskell et al. |

(Continued)

FOREIGN PATENT DOCUMENTS

| EP | 0853335 A2 | 7/1998 |
| KR | 20030013146 A | 2/2003 |

(Continued)

OTHER PUBLICATIONS

Patent Coopertation Treaty, "The International Search Report and the Written Opinion" Issued for International Patent Application No. PCT/US2011/054521. May 2, 2012. (8 Pages).

(Continued)

*Primary Examiner* — Lan Vinh
*Assistant Examiner* — Maki Angadi
(74) *Attorney, Agent, or Firm* — Tutunjian & Bitetto, P.C.; Catherine Ivers

(57) ABSTRACT

A planarization method includes planarizing a semiconductor wafer in a first chemical mechanical polish step to remove overburden and planarize a top layer leaving a thickness of top layer material over underlying layers. The top layer material is planarized in a second chemical mechanical polish step to further remove the top layer and expose underlying layers of a second material and a third material such that a selectivity of the top layer material to the second material to the third material is between about 1:1:1 to about 2:1:1 to provide a planar topography.

20 Claims, 2 Drawing Sheets

(56) References Cited

U.S. PATENT DOCUMENTS

| | | | |
|---|---|---|---|
| 5,173,439 A | 12/1992 | Dash et al. | |
| 5,712,185 A | 1/1998 | Tsai et al. | |
| 5,736,462 A | 4/1998 | Takahashi et al. | |
| 5,738,800 A | 4/1998 | Hosali et al. | |
| 5,759,917 A | 6/1998 | Grover et al. | |
| 5,938,505 A | 8/1999 | Morrison et al. | |
| 5,961,794 A | 10/1999 | Morita | |
| 6,015,755 A | 1/2000 | Chen et al. | |
| 6,114,249 A | 9/2000 | Canaperi et al. | |
| 6,117,748 A | 9/2000 | Lou et al. | |
| 6,319,836 B1 | 11/2001 | Dunton et al. | |
| 6,361,402 B1 | 3/2002 | Canaperi et al. | |
| 6,491,843 B1 | 12/2002 | Srinivasan et al. | |
| 6,544,892 B2 | 4/2003 | Srinivasan et al. | |
| 6,580,137 B2 | 6/2003 | Parke | |
| 6,616,514 B1 | 9/2003 | Edelbach et al. | |
| 6,617,251 B1 | 9/2003 | Kamath et al. | |
| 6,743,683 B2 | 6/2004 | Barns et al. | |
| 6,746,316 B2 | 6/2004 | Chopra et al. | |
| 6,756,643 B1 | 6/2004 | Achuthan et al. | |
| 6,812,076 B1 | 11/2004 | Achuthan et al. | |
| 6,824,579 B2 | 11/2004 | Ronay | |
| 6,855,607 B2 * | 2/2005 | Achuthan et al. | 438/283 |
| 6,964,923 B1 | 11/2005 | Ronay | |
| 6,982,464 B2 | 1/2006 | Achuthan et al. | |
| 7,029,509 B2 | 4/2006 | Kim et al. | |
| 7,071,105 B2 | 7/2006 | Carter et al. | |
| 7,091,164 B2 | 8/2006 | Srinivasan et al. | |
| 7,125,321 B2 | 10/2006 | Prince et al. | |
| 7,125,776 B2 | 10/2006 | Achuthan et al. | |
| 7,166,506 B2 | 1/2007 | Prince et al. | |
| 7,217,989 B2 | 5/2007 | Hiramitsu et al. | |
| 7,271,088 B2 | 9/2007 | Jung et al. | |
| 7,531,105 B2 * | 5/2009 | Dysard et al. | 252/79.1 |
| 2008/0045014 A1 | 2/2008 | Chen et al. | |
| 2008/0305610 A1 | 12/2008 | Chen et al. | |
| 2009/0057769 A1 | 3/2009 | Wei et al. | |
| 2009/0087974 A1 | 4/2009 | Waite et al. | |
| 2010/0048007 A1 | 2/2010 | Lee et al. | |
| 2010/0059823 A1 | 3/2010 | Chung et al. | |
| 2010/0062577 A1 | 3/2010 | Liao et al. | |

FOREIGN PATENT DOCUMENTS

| | | |
|---|---|---|
| KR | 20080084293 A | 9/2008 |
| KR | 20080101454 A | 11/2008 |
| KR | 20090026984 A | 3/2009 |
| KR | 20090038141 A | 4/2009 |

OTHER PUBLICATIONS

America, W., et al. "Slurry Additive Effects on the Suppression of Silicon Nitride Removal During CMP" Electrochemical and Solid-State Letters, vol. 7, Issue 12. Nov. 2004. pp. 327-330.

Arnaud, F., et al. "32NM General Purpose Bulk CMOS Technology for High Performance Applications At Low Voltage" IEDM Technical Digest, Dec. 2008. pp. 633-636.

Auth, C., et al. "45NM High-K + Metal Gate Strain-Enhanced Transistors" 2008 Symposium on VLSI Technology Digest of Technical Papers. 2008. pp. 128-129.

Blumenstock, K., et al. "Shallow Trench Isloation for Ultra-Large-Scale Integrated Devices" J. Vac. Sci. Technol. B 12(1). Jan.-Feb. 1994. pp. 54-58.

Boning, D., et al. "Nanotopography Issues in Shallow Trench Isolation CMP" Material Research Society (MRS) Bulletin. Oct. 2002. pp. 761-765.

Boyd, J., et al. "A One-Step Shallow Trench Global Planarization Process Using Chemical Mechanical Polishing" Journal of the Electrochemical Society, Vol. 144, No. 5. May 1997. pp. 1838-1841.

Bu, K., et al. "Selective Chemical Mechanical Polishing Using Surfactants" Journal of the Electrochemical Society, vol. 154, Issue 7. May 2007. pp. 631-635.

Chau, R. "Advanced Metal Gate/High-K Dielectric Stacks for High-Performance CMOS Transistors" Proceedings of the American Vacuum Society 5th International Conference on Microelectronics and Interfaces (ICMI). Mar. 2004. (3 Pages).

Chau, R., et al. "30NM Physical Gate Length CMOS Transistors With 1.0 PS N-MOS and 1.7 PS P-MOS Gate Delays" 2000 International Electron Devices Meeting, Dec. 2000. pp. 45-48.

Chau, R., et al. "High-K/Metal-Gate Stack and its MOSFET Characteristics" IEEE Electron Device Letters, vol. 25, No. 6. Jun. 2004. pp. 408-410.

Choi, J., et al. "Chip Scale Prediction of Nitride Erosion in High Selectivity STI CMP" Proceedings of 2006 CMP-MIC. Feb. 2006. (10 Pages).

Choi, J., et al. "Chip Scale Topography Evolution Model for CMP Process Optimization" Proc. 2005 IEEE International Symposium on Semiconductor Manufacturing, IEEE. Sep. 2005. (6 Pages).

Choi, K., et al. "Extremely Scaled Gate-First High-K/Metal Gate Stack With EOT of 0.55 NM Using Novel Interfacial Layer Scavenging Techniques for 22NM Technology Node and Beyond" 2009 Symposium on VLSI Technology Digest of Technical Papers. Jun. 2009. pp. 138-139.

Colinge, J. "Finfets and Other Multi-Gate Transistors" Integrated Circuits and Systems. Nov. 2007. (5 Pages).

Cummings, J., et al. "A Comparative Study of Ceria-Based and Silica-Based Slurries for 32NM Shallow Trench Isolation Chemical Mechanical Planarization" Thirteenth International C.M.P. Planarization for ULSI Multilevel Interconnection Conference. Mar. 2008. (8 Pages).

Davari, B., et al. "A New Planarization Technique, Using a Combination of Rie and Chemical Mechanical Polish (CMP)" Electron Devices Meeting, 1989. IEDM '89. Technical Digest., International. Dec. 1989. pp. 61-64.

Haensch, W., et al. "Silicon CMOS Devices Beyond Scaling" IBM Journal of Research and Development, vol. 50, No. 4/5. Jul.-Sep. 2006. pp. 339-361A.

Harris, H., et al. "Band-Engineered Low PMOS VT With High-K/Metal Gates Featured in a Dual Channel CMOS Integration Scheme" 2007 Symposium on VLSI Technology Digest of Technical Papers. Jun. 2007. pp. 154-155.

Ishihara, T., et al. "Universal Mobility Modeling and Its Application to Interface Engineering for Highly Scaled MOSFETS Based on First-Principles Calculation" 2009 IEEE. Interntional Electron Devices Meeting, IEDM '09. Dec. 2009. pp. 75-78.

Kahng, A., et al. "Fill for Shallow Trench Isolation CMP" 2006 International Conference on Computer-Aided Design (ICCAD'06). Nov. 2006. (8 Pages).

Kaneko, A., et al. "Sidewall Transfer Process and Selective Gate Sidewall Spacer Formation Technology for Sub-15NM FINFET with Elevated Source/Drain Extension" IEEE International Electon Devices Meeting (IEDM 2005). Dec. 2005. (4 Pages).

Kotlyar, R., et al. "Inversion Mobility and Gate Leakage in High-K/Metal gate MOSFETS" IEEE International Electron Devices Meeting (IEDM 2004). Dec. 2004. pp. 391-394

Lai, C., et al. "A Novel 'Hybrid' High-K/Metal Gate Process for 28NM High Performance CMOSFETS" IEEE International Electron Devices Meeting (IEDM 2009). Dec. 2009. pp. 655-658.

Lee, B. "Modeling of Chemical Mechanical Polishing for Shallow Trench Isolation" Massachusetts Institute of Technology: Department of Electrical Engineering and Computer Science. Thesis Paper. May 2002. (201 Pages).

Lee, B., et al. "Using Smart Dummy Fill and Selective Reverse Etchback for Pattern Density Equalization" Proc. CMP-MIC. Feb.-Mar. 2000. pp. 255-258.

Mistry, K., et al. "A 45NM Logic Technology With High-K+Metal Gate Transistors, Strained Silicon, 9 CU Interconnect Layers, 193 NM Dry Patterning, and 100% PB-Free Packaging" IEEE International Electron Devices Meeting (IEDM 2007). Dec. 2007. (4 Pages).

Pan, J., et al. "Planarization and Integration of Shallow Trench Isolation" 1998 VMIC. VLSI Multilevel Interconnect Conference. Jun. 1998. pp. 1-6.

Prasad, Y., et al. "Role of Amino-Acid Adsorption on Silica and Silicon Nitride Surfaces During STI CMP" Electrochemical and Solid-State Letters, vol. 9, Issue 12. Sep. 2006. pp. 337-339.

Ranade, R., et al. "High Performance 35NM Lgate CMOS Transistors Featuring NISI Metal Gate (FUSI), Uniaxial Strained Silicon Channels and 1.2NM Gate Oxide" IEEE International Electron Devices Meeting (IEDM 2005). Dec. 2005. (4 Pages).

Romer, A., et al. "STI CMP Using Fixed Abrasive Demands, Measurement Methods and Results" CMP-MIC, Mar. 2000. (10 Pages).

Schlueter, J. "Trench Warfare: CMP and Shallow Trench Isolation" Semiconductor International. Oct. 1999. (5 Pages).

Steigerwald, J. "Chemical Mechanical Polish: The Enabling Technology" IEEE International Electron Devices Meeting (IEDM 2008). Dec. 2008. pp. 37-39.

Takahashi, H., et al. "Interaction Between Ultrafine Ceria Particles and Glycine" Journal of Ceramic Processing Research. vol. 5, No. 1. 2004. pp. 25-29.

Tomimatsu, T., et al. "Cost Effective 28-NM LSTP CMOS Using Gate-First Metal Gate/High-K Technology" 2009 Symposium on VLSI Technology Digest for Technical Papers. Jun. 2009. pp. 36-37.

Veera, R., et al. "Selective Chemical Mechanical Polishing of Silicon Dioxide Over Silicon Nitride for Shallow Trench Isolation Using Ceria Slurries" Journal of The Electrochemical Society. vol. 156, Issue 12. Oct. 2009. pp. 936-943.

Vo, T., et al. "Improved Planarization for STI With Fixed Abrasive Technology" Solid State Technology. Jun. 2000. (7 Pages).

Xie, X., et al. "Integrated Modeling of Nanotopography Impact in Patterned STI CMP" Microsystems Technology Laboratories. ULSI Multilevel Interconnect Conference. Feb. 2003. pp. 1-23. http://www-mtl.mit.edu/researchgroups/Metrology/PAPERS/CMPMIC-nanomodel-talk-feb2003.pdf.

\* cited by examiner

CHEMICAL MECHANICAL PLANARIZATION PROCESSES FOR FABRICATION OF FINFET DEVICES

RELATED APPLICATION INFORMATION

This application claims priority to U.S. Provisional Ser. No. 61/389,546 filed on Oct. 4, 2010, incorporated herein by reference in its entirety.

This application is related to commonly assigned applications: "SHALLOW TRENCH ISOLATION CHEMICAL MECHANICAL PLANARIZATION", Ser. No. 13/012,142, filed concurrently herewith; "CHEMICAL MECHANICAL PLANARIZATION WITH OVERBURDEN MASK", Ser. No. 13/012,821, filed concurrently herewith; and "FABRICATION OF REPLACEMENT METAL GATE DEVICES", Ser. No. 13/012,879, filed concurrently herewith, all incorporated herein by reference.

TECHNICAL FIELD

The present invention relates to semiconductor fabrication and more particularly to methods for chemical mechanical planarization (CMP) for fin field effect transistor structures and the like.

RELATED ART

The great success of the complementary metal oxide semiconductor (CMOS) technology can be attributed to the scalability of the transistor. For over a quarter of a century very little has changed in the basic transistor design except the dimensions. The scaling concept requires that all the physical dimensions (length, width and thickness) be reduced simultaneously. As these physical dimensions start approaching molecular scales, it has become extremely difficult to achieve performance gain by simple device scaling alone. Several strategies involving new device structures and material options are being developed in an attempt to extend the planar transistor design and preserve device scaling beyond ~50 nm gate length.

One way to overcome the difficulties associated with device scaling is to build multi-gate devices. These devices maintain scaling advantages by better control of the channel. As gate length becomes smaller and smaller, the close proximity of the source and drain reduces the ability of a gate electrode to control the potential distribution and current flow in the channel. Under these conditions short channel effects (SCE) set in, limiting the ability to go below the ~50 nm gate length. The short channel effects are attributed to two physical phenomena: modification of the threshold voltage ($V_t$) due to the shortening of the channel length, and limitations imposed on electron transport (mobility) in the channel. A decrease of the threshold voltage ($V_t$) due to decreased gate length is called threshold voltage roll off. The short channel effects can be minimized by reducing the gate oxide thickness, reducing the junction depth and increasing the dopant concentrations in the channel along with the use of silicon-on-insulator (SOI) technology. These ideas have been already incorporated in modern transistor devices and have reached practical limitations as 22 nm nodes are approached.

In an effort to overcome short channel effects, transistors have evolved from planar single gate devices to three dimensional devices with multi gate (double, triple or quadruple gate) structures. A double gate is actually a single gate electrode present on opposite sides of the device and a triple gate is a single gate folded over three sides of the device. Several integration schemes have been provided for the fabrication of fin field effect transistors (FinFETs) (multigate) devices with high-k metal gate transistors.

Multi-gate FinFET fabrication includes a chemical mechanical polishing step that suffers from dishing and uneven dielectric removal to expose underlying layers. FinFET fabrication is especially sensitive to variations in the chemical mechanical polishing step.

SUMMARY

A planarization method includes planarizing a semiconductor wafer in a first chemical mechanical polish step to remove overburden and planarize a top layer leaving a thickness of top layer material over underlying layers. The top layer material is planarized in a second chemical mechanical polish step to further remove the top layer and expose underlying layers of a second material and a third material such that a selectivity of the top layer material to the second material to the third material is between about 1:1:1 to about 2:1:1 to provide a planar topography.

A planarization method for fin field effect transistor (FinFET) fabrication includes planarizing a FinFET structure in a first chemical mechanical polish step to remove overburden and planarize an oxide top layer leaving a thickness of 300 to 600 Å over underlying layers; and planarizing, in a second chemical mechanical polish step, to further remove the oxide and expose underlying nitride and polysilicon areas such that the oxide:nitride:polysilicon selectivity is between about 1:1:1 to about 2:1:1 to provide a planar topography.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1A:
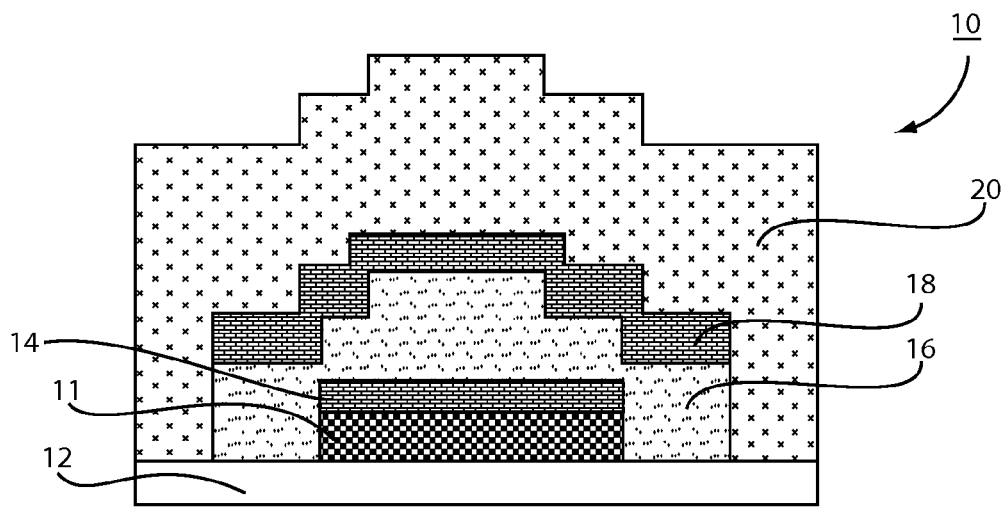
FIGS. 1A-1C illustrate cross-sectional views of a semiconductor device in a two step polish process for FinFET structures in accordance with the present principles.

Methods for planarization of semiconductor structures, such as fin field effect transistor (FinFET) structures are provided. The present principles employ slurries with appropriate selectivity to polish certain materials in preference to other materials to achieve a highly planar final structure. In a case of FinFET devices, a bulk of an overburden layer is removed by a first chemical mechanical polishing/planarization (CMP) using a slurry that has a high removal rate for the overburden and a relatively low removal rate for the underlying layer. This reduces an initial topography and, if the overburden is oxide, leaves about 300 to 600 Å of oxide remaining on an underlying layer (e.g., nitride). In the case of FinFET devices, a second CMP step is performed to remove the overburden (e.g., oxide), open up the underlying layer (nitride) and expose a conductive material (e.g., doped polysilicon) below the underlying layer. In this example, a slurry with the polish rate selectivity ratio of about 1:1:1 for oxide, nitride and polysilicon is employed for final planarization. The compositions of the slurries used the various polish steps are disclosed.

The flowchart and block diagrams in the Figures may, in some alternative implementations, occur out of the order noted in the figures. For example, two blocks shown in succession may, in fact, be executed substantially concurrently, or the blocks may sometimes be executed in the reverse order, depending upon the functionality involved.

It is to be understood that the present invention will be described in terms of given illustrative architectures; however, other architectures, structures, substrate materials and process features and steps may be varied within the scope of the present invention. Throughout this disclosure, oxide, nitride and polysilicon materials are described. However, these materials are illustrative and other materials are also contemplated and within the scope of the invention. In addition, thickness dimensions are described throughout this disclosure. These thickness dimensions are illustrative, and other dimensions may be employed in accordance with the present principles.

Circuits and devices as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements, FIG. 1A is a cross-sectional view of an illustrative structure 10 for a fin field effect transistor (FinFET). The fabrication process is shown as an example to demonstrate the present principles. The structure 10 may be formed on a substrate 12 of a semiconductor wafer. The substrate 12 may include a bulk substrate, a semiconductor-on-insulator substrate such as silicon-on-insulator (SOI), or any other suitable substrate. In accordance with the present principles, any number of substrate materials may be employed. A semiconductor fin structure 14 has been patterned, e.g., using a fin mask or the like, on top of a single-crystal (e.g., silicon) surface layer 11 which may be part of a SOI structure.

In a particularly useful embodiment, fin structure 14 includes polycrystalline Si fins embedded in silicon nitride. A conductive material 16 is formed over the sides and on top of the fin structure 14. The conductive material 16 may include a doped polysilicon. The conductive material 16 will be formed into a gate conductor during subsequent processing. The gate conductor may include a double or triple gate structure. for example, a double gate is actually a single gate electrode present on opposite sides of the fin structure 14, and a triple gate is a single gate folded over three sides (top and side) of the fin structure 14.

The conductor material 16 is patterned using a gate mask 18. The gate mask 18 may include a nitride or other suitable dielectric material. An isolation deposition 20 is formed over the gate mask 18 and is employed to provide insulation for sidewalls of the conductive material 16 and/or fill in other areas of the wafer.

The present principles achieve highly planar post chemical mechanical polishing/planarization (CMP) of surfaces by a two step CMP process that employs slurries with different selectivity between at least three different materials. For illustrative purposes the three materials will be described as oxide, nitride and polysilicon.

Figure 1B:
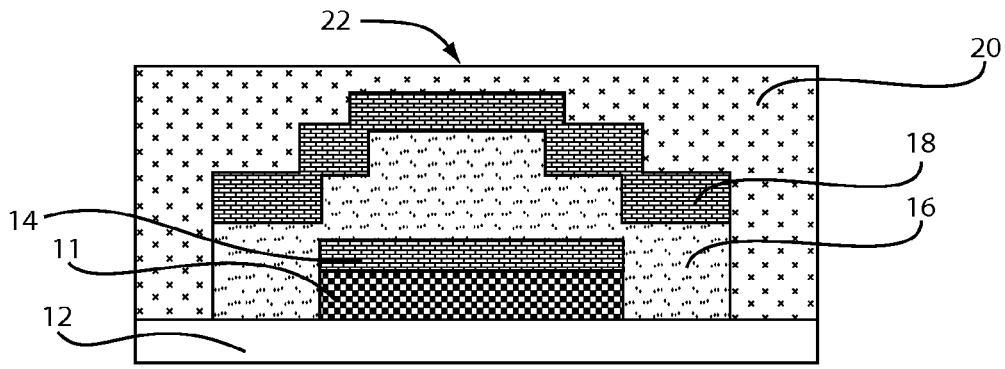

Referring to FIG. 1B, in a first step, excess overburden of layer 20 is removed. The overburden of layer 20 may include an oxide and an underlying layer (gate mask 18) may include a nitride. In one embodiment, approximately 300 Å of oxide remains over the underlying layer 18 after this polish/planarization step. For this step, an oxide polish slurry with, e.g., 4:1 oxide to nitride selectivity or ceria/surfactant based slurry can be used to form surface 22.

Figure 1C:
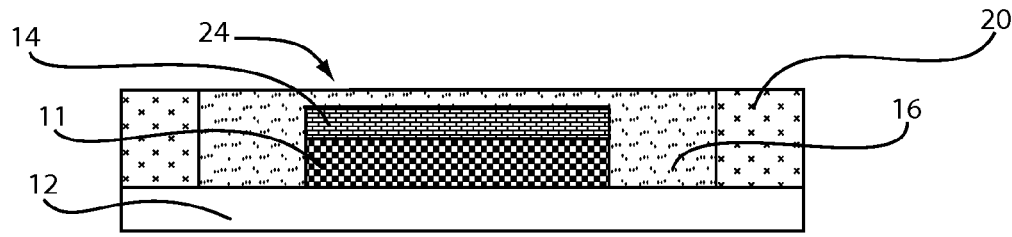

Referring to FIG. 1C, in a second step, slurry with an approximate 1:1:1 (oxide:nitride:polysilicon) polish rate selectivity is employed. The conductive material 16 includes the polysilicon, which is below the gate mask 18 (nitride) in this instance.

The oxide may be formed by, e.g., a high density plasma (HDP) process. The nitride may be formed by, e.g., low pressure chemical vapor deposition (LPCVD) or a rapid thermal chemical vapor deposition (RTCVD). The poly silicon may be formed by, e.g., LPCVD or RTCVD. Other processes may also be employed. The second planarization achieves equal or near equal polish rates for oxide, nitride and polysilicon in the various parts of the structure to avoid dishing and erosion due to differences in the polish rates of the three materials. The CMP process forms surface 24.

Slurry compositions for the CMP processes are particularly useful in the formation of FinFET devices, although other structures and processes may benefit as well and may be employed. The present principles are particularly useful in structures where three materials such as oxide, nitride and polysilicon need to be planarized concurrently.

For the first CMP to form surface 22 in FIG. 1B, a large initial topography is reduced while removing the bulk of the oxide overburden, and this leaves a planar oxide layer of approximately 300 Å everywhere on the die (e.g., the thickness between surface 22 and layer 18). Since a high oxide removal rate is desired and virtually no nitride surfaces are exposed during the initial stages of the polish, the slurry selectivity is not as important a factor in this step. This can be achieved by oxide polish slurries with approximately, e.g., a 4:1 oxide to nitride selectivity. The oxide slurries may include alkaline solutions like potassium hydroxide or ammonium hydroxide and silica abrasives which are selected from fumed silica and colloidal silica. However, to improve the planarity and achieve uniform oxide thickness across various pattern densities, it may be necessary to incorporate additives to the oxide slurries. Ceria/surfactant systems may also be employed in this step to achieve the desired planarity and uniformity.

For the second CMP to form surface 24 in FIG. 1C, the remaining ~300 Å of the oxide layer is removed to expose the underlying surfaces and achieve a highly planar final surface 24 that is free of defects such as polish scratches, pits and other blemishes. To achieve high planarity, it is necessary to have approximately the same polish rates for oxide, nitride and polysilicon covered surfaces. The polish rates of oxide, nitride and polysilicon should not be very high since this inevitably will lead to poor controllability. Thus, it would be highly desirable to have slurry that has polish rates in the range of about 300 to about 600 Å/min for the three materials. This will provide appropriate polish times with good controllability and permit over-polish margins to planarize hard to polish structures.

For chemical mechanical planarization, polish rates of different materials vary with line width, pattern density and feature size in the actual circuit layout. Local polish rates of different materials in patterned structures are very complex functions of the polish rates of the same materials in blanket wafers. Thus, it is desirable to optimize the slurry selectivity by polishing patterned wafers and measuring the planarity experimentally to ensure that the desired goals are achieved. Since die layouts vary between technology nodes and even among different products in a same technology node, it is highly desirable to be able to change the polish rate selectivity by varying the concentrations of the components in the slurry. Thus, polish rate selectivity is "tunable" within a range for a slurry system to be usable across a wide range of products and technology nodes. The ability to tune the polish rate selectivity is a factor in the second polish step (FIG. 1C) in achieving a highly planar final surface using the present principles.

A slurry according to particularly useful embodiments includes the following components: a) Abrasive, b) pH modulator, c) Organic acid. a) Abrasive: The abrasive may be at least one type of abrasive particle selected from inorganic and/or organic materials. Examples of the inorganic abrasive particles may include silica, alumina, titania, zirconia, ceria, and the like. Examples of the silica may include fumed silica, silica synthesized by a sol-gel method, and colloidal silica. The fumed silica may be obtained by reacting silicon tetra chloride with oxygen and water in gaseous phase. The silica synthesized by the sol-gel method may be obtained by hydrolysis and/or condensation of an alkoxysilicon compound. The colloidal silica may be obtained by hydrolysis of purified silicon compounds in solution phase. Examples of the organic particles may include polyvinyl chloride, styrene (co)polymer, polyacetal, polyester, polyamide, polycarbonate, olefin (co)polymers, phenoxy resins, and acrylic (co) polymers. Examples of the olefin (co)polymers may include polyethylene, polypropylene, poly-1-butene, and poly-4-methyl-1-pentene. Examples of the acrylic (co)polymers may include polymethyl methacrylate and the like. An average particle diameter of the abrasive may be in the range 5 to 500 nm, more preferably 20 to 150 nm. An appropriate polishing rate can be achieved using the abrasive particles having an average diameter within this range. The colloidal silica may be obtained commercially (e.g., from Fuso Chemical Co., Ltd., Japan) with a primary particle diameter of, e.g., 35 nm. This colloidal silica abrasive is an example of a commercial silica abrasive and may be employed in that capacity in all of the examples mentioned herein.

b) pH modulator: The pH of the slurry according to one embodiment is in the range of 1 to 11 and preferably 2 to 6. An appropriate polish rate can be achieved by adjusting the pH of the slurry to a value within this range. Examples of pH modulators may include organic bases, inorganic bases, and inorganic acids. Examples of organic bases may include tetramethylammonium hydroxide, triethylamine, and the like. Examples of the inorganic bases may include ammonium hydroxide, potassium hydroxide, and sodium hydroxide. Examples of the inorganic acids may include nitric acid, sulfuric acid, phosphoric acid, and hydrochloric acid.

c) Organic acid: Organic acid is employed as an accelerator for nitride polishing. Various organic acids such as monobasic acids (e.g., monocarboxylic acids), dibasic acids (e.g., dicarboxylic acids), polybasic acids (e.g., polycarboxylic acids), and carboxylic acids with substituted groups (hydroxyl, amine) may be employed. Examples of such organic acids include saturated acids, unsaturated acids, aromatic acids, and aliphatic acids. Examples of the saturated acids may include formic acid, acetic acid, butyric acid, oxalic acid, malonic acid, succinic acid, glutaric acid, and adipic acid. Examples of the acids including hydroxyl groups may include lactic acid, malic acid, tartaric acid, and citric acid. Examples of the unsaturated acids may include maleic acid and fumaric acid. Examples of the aromatic acids may include benzoic acid and phthalic acid. It is preferable to use an organic acid having two or more carboxylic acid groups to obtain a high polish rate of nitride. The potassium or ammonium salts of these organic acids may also be used.

Other components: The present principles permit the addition of other ingredients into the slurry to tune, e.g., the oxide to nitride to polysilicon selectivity. The slurry according to these embodiments may include a surfactant, if necessary. Examples of surfactants may include anionic, nonionic, and cationic surfactants. Examples of anionic surfactants may include a surfactant having at least one functional group selected from a carboxyl group (—COOX), a sulfonic acid group (—SO$_3$X), and a phosphate group (—HPO$_4$X) (wherein X represents hydrogen, ammonium, or a metal). Examples of the anionic surfactants may include aliphatic and aromatic sulfates and sulfonates, and phosphate salts. Compounds such as potassium dodecylbenzenesulfonate, ammonium dodecylbenzenesulfonate, sodium alkylnaphthalenesulphonate, alkyl sulfosuccinate, potassium alkenylsuccinate may be employed. Salts of fatty acids like potassium oleate may be used. These anionic surfactants may be used either individually or in combination with other surfactants. Examples of the nonionic surfactants may include polyoxyethylene alkyl ethers, ethylene oxide-propylene oxide block copolymers, acetylene glycol, ethylene oxide addition product of acetylene glycol, acetylene alcohol, and the like. Note that a nonionic polymer such as polyvinyl alcohol, cyclodextrin, polyvinyl methyl ether, or hydroxyethylcellulose may also be used. Examples of the cationic surfactants may include an aliphatic amine salts and aliphatic ammonium salts. In addition, polyelectrolytes such as poly (acrylic acid) and their salts such as sodium, potassium and ammonium can also be added during the polishing to control the selectivity. The present principles include the functions of the components of the slurry further described below by way of examples. Note that these examples should not be construed as limiting.

In example 1, a slurry suitable for a step two CMP (FIG. 1B to FIG. 1C) polish may include the following. Silica abrasives in the range of 0.5 to 30% by weight, the preferred range being 5 to 10% by weight; an organic acid in the range of 0.5 to 50 g/L, the preferred range being 3 to 25 g/L; an acidic pH modulator in the range of 0.01 to 5 g/L, the preferred range being 0.1 to 2.0 g/L; an alkaline pH modulator in the range of 0 to 5 g/L, the preferred range being 0 to 2 g/L; and the pH of the slurry in the range of 1 to 11, the preferred range being 2 to 6.

In example 2, a formulation of example 1 may include the following. 5 W % of colloidal silica abrasives dispersed in water, 5 g/L of citric acid, 0.25 to 0.35 g/L of phosphoric acid, 0.1 to 0.5 g/L of ammonium hydroxide, pH in the range of 2-5, the preferred pH being approximately 4.

In example, 3, a formulation of example 1 may include the following. 10 W % of colloidal silica abrasives dispersed in water, 10 g/L of citric acid, 1 to 2 g/L of phosphoric acid, 0.1 to 2.0 g/L of ammonium hydroxide, pH in the range of 2-5.

In another embodiment, the slurry includes two parts: Part 1: a silica abrasive slurry, organic acid, and an acidic pH modulator; and Part 2: an alkaline pH modulator, and acidic pH modulator. The slurry can be supplied to a polishing table as two components and allowed to mix on the polishing table to create slurry with the desired final composition. By using the same or different slurry flow rates, a slurry composition can be varied during the polish to get desirable polish rates for oxide, nitride and polysilicon at different stages of polish. In another example, initially Part 1 and Part 2 are used and after a certain time Part 2 is switched off to create slurry with a different selectivity than the original formulation. Similar effects can be achieved by keeping the flow rate of one of the components constant and varying the other as polishing progresses.

In another embodiment, the slurry includes two parts: Part 1: a silica abrasive slurry, organic acid and an acidic pH modulator; Part 2: a silica abrasive slurry, an alkaline pH modulator and an acidic pH modulator. The slurry can be supplied to the polishing table as two components and permitted to mix on the polishing table to create slurry with the desired final composition. By using the same or different slurry flow rates, a slurry composition can be varied during the polish to get desirable polish rates for oxide, nitride and polysilicon at different stages of the polish. Initially, Part 1 is used and after a certain time Part 1 is switched off and Part 2 is switched on to create a slurry with a different oxide to nitride to polysilicon selectivity than the original formulation.

In accordance with the present principles, scanning electron microscope (SEM) micrographs of FinFET structures polished with a conventional one step CMP process using a ceria abrasive slurry were compared to SEM micrographs of FinFET structures polished with the two step CMP process using the slurries described in accordance with the present principles. The conventional process failed, in many instances to clear all of the gate mask layer (18) to expose the conductive material (16) (see e.g., FIG. 1A). The process in accordance with the present principles results in clearing all of the gate mask material (18) from the conductive material (16) for all observed fin structures. In addition, the SEM micrographs show planarity of the FinFET structure after the two step CMP process with no significant dishing between the polysilicon conductive material and the adjacent oxide regions of layer 20 (see FIG. 1C). The conventional process had significant dishing.

Figure 2:
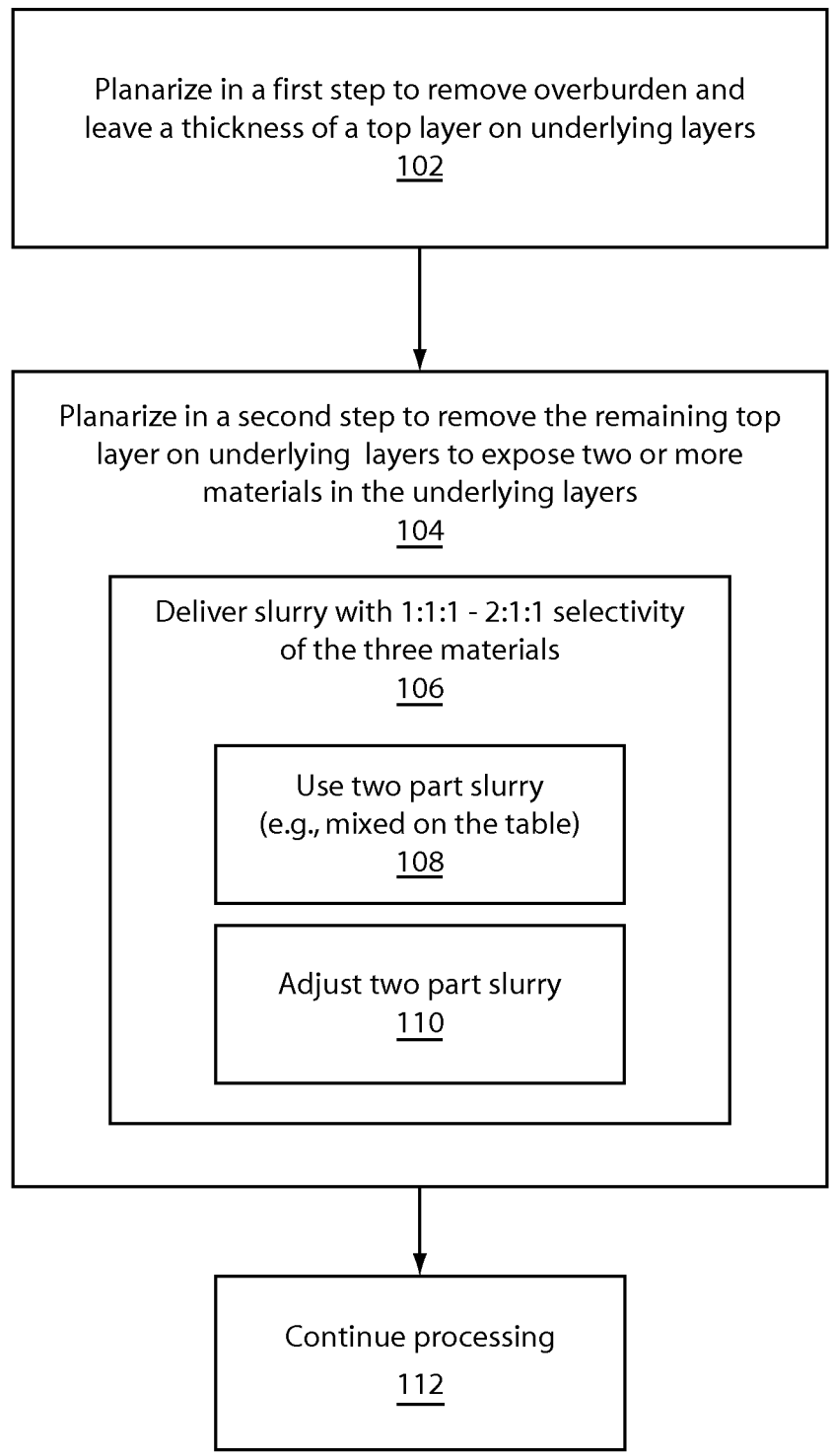
FIG. 2 is a flow diagram showing a planarization method for fabricating a device structure while concurrently planarizing three or more materials in accordance with the present principles.

Referring to FIG. 2, a method for polishing FinFET structures and the like in two steps to planarize oxide layers and expose and polish the underlying nitride and polysilicon covered areas is illustratively shown. It should be understood that different combinations of these and other materials may be employed. In block 102, the method includes a first step chemical mechanical polish to remove overburden and planarize the oxide layers leaving a thickness of the oxide, e.g., about 300 to 600 Å of oxide remain. This polish is accomplished by an oxide slurry containing, e.g., silica abrasives or slurries containing ceria abrasives and a surfactant. In block 104, a second chemical mechanical polish includes the continued removal of the oxide layer(s) and exposure of underlying nitride and polysilicon covered surfaces with an oxide:nitride:polysilicon selectivity of approximately 1:1:1 to 2:1:1 to accomplish a highly planar topography.

In block 106, a slurry is delivered for planarizing in accordance with the second planarization step. The slurry for the block 104 preferably includes silica abrasives dispersed in aqueous solutions from, e.g., 0.5 to 30 W %. In addition, the slurry for block 104 may include an organic acid in the range of 0.01 to 30 g/L. The slurry for block 104 may include an acidic pH modulator in the range of 0.01 to 10 g/L. Further, the slurry for block 104 may include an alkaline pH modulator in the range of 0 to 15 g/L. The pH range of the slurry for block 104 may be from 1 to 11. A preferred composition of the slurry for block 104 includes 5 W % of colloidal silica abrasives dispersed in water, 0.5 to 50 g/L of organic acid having two or more carboxylic acid groups, 0.25 to 0.35 g/L of inorganic acid, 0.1 to 1.0 g/L of inorganic base, pH in the range of 2-5, the preferred pH being about 4.

In one embodiment, the slurry can be delivered, in block 108, as a two part slurry. One example of a two part slurry includes: Part 1: 0.5 to 30% silica abrasive slurry, 0.5 to 50 g/L organic acid, 0.01 to 5 g/L acidic pH modulator; and Part 2: 0.01 to 5 g/L alkaline pH modulator, 0.01 to 50 g/L acidic pH modulator. The slurry can be supplied to a polishing table as two components and allowed to mix on the polishing table to create slurry with the desired final composition. By using the same or different slurry flow rates, slurry composition can be varied during the polish to get desirable polish rates for oxide, nitride and polysilicon at different stages of polish.

In another embodiment, the slurry can be used as a two part slurry (block 108) with the following composition: Part 1: 0.5 to 30% silica abrasive slurry, 0.5 to 50 g/L organic acid, 0.01 to 5 g/L acidic pH modulator; Part 2: 0.5 to 30% silica abrasive slurry, 0.01 to 5 g/L alkaline pH modulator, 0.01 to 50 g/L acidic pH modulator. The slurry can be supplied to the table as two components and allowed to mix on the polishing table to create slurry with the desired final composition. In block 110, by using the same or different slurry flow rates, slurry composition can be varied during the polish to get desirable polish rates for oxide, nitride and polysilicon at different stages of polish.

Having described preferred embodiments for chemical mechanical planarization processes for fabrication of FinFET devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A planarization method, comprising:
    planarizing a semiconductor wafer in a first chemical mechanical polish step to remove overburden and planarize a top layer leaving a thickness of top layer material over underlying layers; and
    planarizing the top layer material in a second chemical mechanical polish step to further remove the top layer and expose underlying layers of a second material and a third material such that a selectivity of the top layer material to the second material to the third material is between about 1:1:1 to about 2:1:1 to provide a planar topography.

2. The method as recited in claim 1, wherein the top layer material, the second material and the third material include oxide, nitride and polysilicon.

3. The method as recited in claim 1, wherein the top layer includes oxide and the thickness includes 300 to 600 Å.

4. The method as recited in claim 1, wherein planarizing a semiconductor wafer in a first chemical mechanical polish step includes polishing the wafer using at least one of silica abrasives and ceria abrasives with a surfactant.

5. The method as recited in claim 1, wherein planarizing the top layer material in a second chemical mechanical polish step includes polishing using a slurry with silica abrasives dispersed in aqueous solution with 0.5 to 30 W %.

6. The method as recited in claim 5, wherein the slurry includes organic acid in a range of 0.01 to 30 g/L.

7. The method as recited in claim 6, wherein the slurry includes an acidic pH modulator in a range of 0.01 to 10 g/L.

8. The method as recited in claim 7, wherein the slurry includes an alkaline pH modulator in a range of 0 to 15 g/L.

9. The method as recited in claim 8, wherein the slurry includes a pH range from 1 to 11.

10. The method as recited in claim 1, wherein planarizing the top layer materials in a second chemical mechanical polish step includes polishing using a slurry having 5 W % of colloidal silica abrasives dispersed in water, 0.5 to 50 g/L of organic acid having two or more carboxylic acid groups, 0.25 to 0.35 g/L of inorganic acid, 0.1 to 1.0 g/L of an inorganic base and a pH in a range of 2-5.

11. The method as recited in claim 1, wherein planarizing the top layer material in a second chemical mechanical polish step includes polishing using a two part slurry including:
   a first part having a 0.5 to 30% silica abrasive slurry, a 0.5 to 50 g/L organic acid, and a 0.01 to 5 g/L acidic pH modulator; and
   a second part having a 0.01 to 5 g/L alkaline pH modulator, and a 0.01 to 50 g/L acidic pH modulator.

12. The method as recited in claim 1, wherein planarizing the top layer material in a second chemical mechanical polish step includes supplying a slurry to a polishing table as two components to mix on the polishing table.

13. The method as recited in claim 12, further comprising adjusting slurry flow rates during a polish to get obtain different polish rates at different stages of the polish.

14. The method as recited in claim 1, wherein planarizing the top layer material in a second chemical mechanical polish step includes polishing using a two part slurry including:
   a first part having a 0.5 to 30% silica abrasive slurry, a 0.5 to 50 g/L organic acid, and a 0.01 to 5 g/L acidic pH modulator; and
   a second part including a 0.5 to 30% silica abrasive slurry, a 0.01 to 5 g/L alkaline pH modulator, and a 0.01 to 50 g/L acidic pH modulator.

15. A planarization method for fin field effect transistor (FinFET) fabrication, comprising:
   planarizing a FinFET structure in a first chemical mechanical polish step to remove overburden and planarize an oxide top layer leaving a thickness of 300 to 600 Å over underlying layers; and
   planarizing, in a second chemical mechanical polish step, to further remove the oxide and expose underlying nitride and polysilicon areas such that the oxide: nitride : polysilicon selectivity is between about 1:1:1 to about 2:1:1 to provide a planar topography.

16. The method as recited in claim 15, wherein planarizing, in a second chemical mechanical polish step, includes polishing using a slurry having 5 W % of colloidal silica abrasives dispersed in water, 0.5 to 50 g/L of organic acid having two or more carboxylic acid groups, 0.25 to 0.35 g/L of inorganic acid, 0.1 to 1.0 g/L of an inorganic base and a pH in a range of 2-5.

17. The method as recited in claim 15, wherein planarizing, in a second chemical mechanical polish step, includes polishing using a two part slurry including:
   a first part having a 0.5 to 30% silica abrasive slurry, a 0.5 to 50 g/L organic acid, and a 0.01 to 5 g/L acidic pH modulator; and
   a second part having a 0.01 to 5 g/L alkaline pH modulator, and a 0.01 to 50 g/L acidic pH modulator.

18. The method as recited in claim 15, wherein planarizing, in a second chemical mechanical polish step, includes supplying a slurry to a polishing table as two components to mix on the polishing table.

19. The method as recited in claim 18, further comprising adjusting slurry flow rates during a polish to get obtain different polish rates at different stages of the polish.

20. The method as recited in claim 15, wherein planarizing, in a second chemical mechanical polish step, includes polishing using a two part slurry including:
   a first part having a 0.5 to 30% silica abrasive slurry, a 0.5 to 50 g/L organic acid, and a 0.01 to 5 g/L acidic pH modulator; and
   a second part including a 0.5 to 30% silica abrasive slurry, a 0.01 to 5 g/L alkaline pH modulator, and a 0.01 to 50 g/L acidic pH modulator.

* * * * *